(12) United States Patent
Yamazaki

(10) Patent No.: US 7,504,625 B2
(45) Date of Patent: Mar. 17, 2009

(54) SUBSTRATE INSPECTION METHOD, MANUFACTURING METHOD OF SEMICONDUCTOR DEVICE AND SUBSTRATE INSPECTION APPARATUS

(75) Inventor: Yuichiro Yamazaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 11/385,706

(22) Filed: Mar. 22, 2006

(65) Prior Publication Data

US 2006/0243907 A1   Nov. 2, 2006

(30) Foreign Application Priority Data

Mar. 23, 2005  (JP) ............... 2005-083967

(51) Int. Cl.
  *G21K 7/00*  (2006.01)
  *G21G 5/00*  (2006.01)
(52) U.S. Cl. .................. 250/310; 250/306; 250/307; 250/311; 250/492.1; 250/492.3; 324/751; 356/237.1; 356/514; 356/515
(58) Field of Classification Search ......... 250/306–311, 250/396 R, 397, 398, 492.1, 492.2, 492.21, 250/492.3; 356/237.1, 513–518; 324/751
See application file for complete search history.

(56) References Cited

U.S. PATENT DOCUMENTS

| | | | | |
|---|---|---|---|---|
| 5,214,282 | A * | 5/1993 | Yamaguchi et al. | 250/307 |
| 5,333,495 | A * | 8/1994 | Yamaguchi et al. | 73/105 |
| 6,476,388 | B1 * | 11/2002 | Nakagaki et al. | 250/310 |
| 7,209,239 | B2 * | 4/2007 | Hwang et al. | 356/495 |

(Continued)

FOREIGN PATENT DOCUMENTS

JP  7-249393  9/1995

(Continued)

OTHER PUBLICATIONS

First Notification of Reason for Rejection issued by the Chinese Patent Office on Jun. 22, 2007, for Chinese Patent Application No. 200610065365.8, and English-language translation thereof.

(Continued)

*Primary Examiner*—Bernard E Souw
(74) *Attorney, Agent, or Firm*—Finnegan, Henderson, Farabow, Garrett & Dunner, L.L.P.

(57) ABSTRACT

A substrate inspection method includes: generating primary charged particle beams; applying the generated primary charged particle beams to an inspection target of a substrate; condensing first secondary charged particle beams including at least one of secondary charged particles, reflected charged particles, and back scattering charged particles which have been generated from the substrate, or first transmitted charged particle beams which have transmitted the inspection target, a phase difference being generated between the secondary charged particle beams or between the transmitted charged particle beams in accordance with a structure of the inspection target; imaging the secondary charged particle beams or the transmitted charged particle beams; detecting the imaged secondary charged particle beams or transmitted charged particle beams and outputting a signal of a secondary charged particle beam image or a transmitted charged particle beam image including information on the phase difference; and detecting a defect in the inspection target by use of the information on the phase difference included in the secondary charged particle beam image or the transmitted charged particle beam image.

22 Claims, 12 Drawing Sheets

U.S. PATENT DOCUMENTS

| | | | |
|---|---|---|---|
| 7,259,869 B2 * | 8/2007 | Hwang et al. | 356/511 |
| 2002/0028399 A1 * | 3/2002 | Nakasuji et al. | 430/30 |
| 2002/0033449 A1 * | 3/2002 | Nakasuji et al. | 250/306 |
| 2002/0148961 A1 * | 10/2002 | Nakasuji et al. | 250/311 |
| 2003/0210391 A1 * | 11/2003 | Uto et al. | 356/237.1 |
| 2005/0112477 A1 * | 5/2005 | Yoshikawa et al. | 430/5 |
| 2005/0114745 A1 * | 5/2005 | Hayashi et al. | 714/724 |
| 2005/0244722 A1 * | 11/2005 | Okada et al. | 430/5 |
| 2005/0263701 A1 * | 12/2005 | Nagahama et al. | 250/310 |
| 2006/0243907 A1 * | 11/2006 | Yamazaki | 250/310 |

FOREIGN PATENT DOCUMENTS

| | | |
|---|---|---|
| JP | 11-132975 | 5/1999 |
| JP | 2005-37291 | 2/2005 |
| JP | 2002-37291 A * | 5/2005 |

OTHER PUBLICATIONS

Tonomura, "Application of Electron Holography", Review of Modern Physics, vol. 59, No. 3, Part I, pp. 639, 643-648.

Yamamoto et al., "Off-axis Electron Holography without Fresnel Fringes," Ultramicroscopy 101, 2004, pp. 265-269.

* cited by examiner

SUBSTRATE INSPECTION METHOD, MANUFACTURING METHOD OF SEMICONDUCTOR DEVICE AND SUBSTRATE INSPECTION APPARATUS

CROSS REFERENCE TO RELATED APPLICATION

This application claims benefit of priority under 35USC .sctn.119 to Japanese patent application No. 2005-083967, filed on Mar. 23, 2005, the contents of which are incorporated by reference herein.

BACKGROUND OF THE INVENTION

1. Field of the Invention

The present invention relates to a substrate inspection method, a manufacturing method of a semiconductor device and a substrate inspection apparatus, and is directed to, for example, an inspection of a substrate using a charged particle beam.

2. Related Background Art

Various techniques have been proposed wherein a rectangular electron beam is formed by an electron gun to illuminate a substrate with the electron beam as a primary beam, and a secondary electron, a reflected electron and a back scattering electron which have been generated in accordance with variation in the shape, material and potential of the surface of the substrate are projected as a secondary beam in an expanded form to an electron detection unit by a map/projection optical system, such that an image of the surface of a sample is obtained and thus applied to a defect inspection of a semiconductor pattern (e.g., Japanese Patent Publication Laid-open No. 7-249393 and Japanese Patent Publication Laid-open No. 11-132975).

According to methods disclosed in these patent documents, the secondary beams comprising the secondary electron, the reflected electron and the back scattering electron which have been generated in accordance with the changes in the shape, material and potential of the substrate surface are imaged via the map/projection optical system, and the contrast of a signal of this image allows the sample surface image to be formed. In such an image forming mechanism, the rate of a material of an inspection target to contribute to the contrast (material contrast) of an obtained image is extremely high since efficiency of the secondary beam generation depends on the material of the inspection target. Further, because the secondary beam generated from an edge portion such as minute concave and convex shapes on the substrate surface does not contribute to the imaging, there has been a problem that it is difficult to obtain an image contrast, and that the amount of information is small regarding the concave and convex shapes. Moreover, the track of the generated secondary beam is deflected by an electric field formed immediately on the substrate surface due to, for example, charge-up, and thus the contrast (potential contrast) of the inspection target due to a surface potential is not imaged on the detector, leading to a decreased contrast. There has also been a problem that if, for example, the back scattering electron is used to reduce such influence of an electromagnetic field immediately on the surface, the influence of the electromagnetic field immediately on the surface is indeed reduced, but along with this, inspection sensitivity regarding the electromagnetic field itself on the substrate surface is significantly lowered.

SUMMARY OF THE INVENTION

According to a first aspect of the present invention, there is provided a substrate inspection method comprising:

generating a primary charged particle beam;

applying the generated primary charged particle beam to an inspection target of a substrate;

condensing a first secondary charged particle beam including at least one of secondary charged particles, reflected charged particles and back scattering charged particles which have been generated from the substrate, or a first transmitted charged particle beam which has transmitted the inspection target, a phase difference being generated in the secondary charged particle beam or in the transmitted charged particle beam in accordance with a structure of the inspection target;

imaging the secondary charged particle beam or the transmitted charged particle beam;

detecting the imaged secondary charged particle beam or transmitted charged particle beam and outputting a signal of a secondary charged particle beam image or a transmitted charged particle beam image including information on the phase difference; and detecting a defect in the inspection target by use of the information on the phase difference included in the secondary charged particle beam image or the transmitted charged particle beam image.

According to a second aspect of the present invention, there is provided a manufacturing method of a semiconductor device comprising a substrate inspection method, said substrate inspection method including:

generating a primary charged particle beam;

applying the generated primary charged particle beam to an inspection target of a substrate;

condensing a first secondary charged particle beam including at least one of secondary charged particles, reflected charged particles and back scattering charged particles which have been generated from the substrate, or a first transmitted charged particle beam which has transmitted the inspection target, a phase difference being generated in the secondary charged particle beam or in the transmitted charged particle beam in accordance with a structure of the inspection target;

imaging the secondary charged particle beam or the transmitted charged particle beam;

detecting the imaged secondary charged particle beam or transmitted charged particle beam and outputting a signal of a secondary charged particle beam image or a transmitted charged particle beam image including information on the phase difference; and detecting a defect in the inspection target by use of the information on the phase difference included in the secondary charged particle beam image or the transmitted charged particle beam image.

According to a third aspect of the present invention, there is provided a substrate inspection apparatus comprising:

a beam source which generates a primary charged particle beam;

an illumination unit which applies the generated primary charged particle beam to an inspection target;

a condensing unit which condenses a secondary charged particle beam including at least one of secondary charged particles, reflected charged particles and back scattering charged particles which have been generated from the inspection target, or a transmitted charged particle beam which has transmitted the inspection target;

an imaging unit which images the secondary charged particle beam or the transmitted charged particle beam;

a charged particle detection unit which detects the imaged secondary charged particle beam or the imaged transmitted charged particle beam, and outputs a signal of a secondary charged particle beam image or a transmitted charged particle beam image including information on a phase difference generated in the secondary charged particle beam or in the transmitted charged particle beam in accordance with a structure of the inspection target; and a signal processing unit which processes the signal of the secondary charged particle beam image or the transmitted charged particle beam image and outputs data on a defect in the inspection target on the basis of the information on the phase difference.

DETAILED DESCRIPTION OF THE INVENTION

Embodiments of the present invention will hereinafter be described in reference to the drawings. A case will be taken up and explained below wherein electron beams are used as charged particle beams, but the present invention is not limited thereto and is applicable to, for example, ion beams and to charged particle beams other than electrons such as an ion beam group.

(1) First Embodiment

Figure 1:
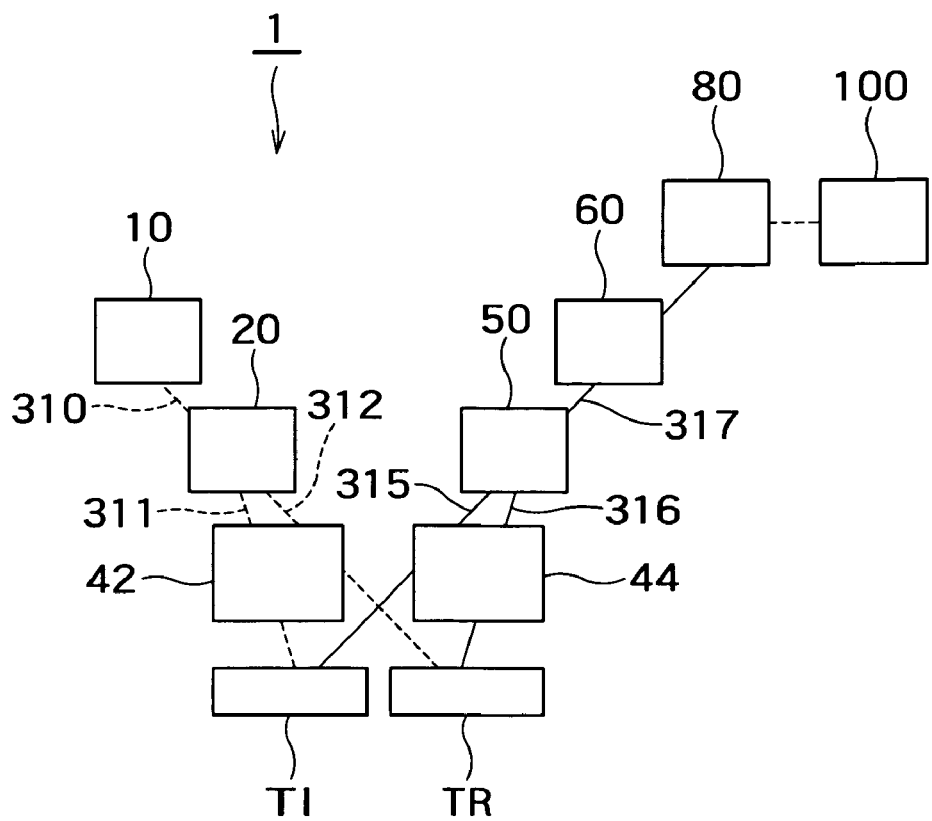
FIG. 1 is a block diagram showing a schematic configuration of a substrate inspection apparatus according to a first embodiment of the present invention.

FIG. 1 is a block diagram showing a schematic configuration of a substrate inspection apparatus according to a first embodiment of the present invention. A reflective electron beam inspection apparatus 1 shown in FIG. 1 comprises an electron source 10, an electron beam splitting unit 20, an illumination unit 42, a light condensing unit 44, a beam superposing unit 50, a map/projection unit 60, an electron detector 80 and an image processing unit 100. The present embodiment is characterized in that a generated primary electron beams 310 are split into inspection target illuminating electron beams 311 and reference target illuminating electron beams 312 which are applied to an inspection target TI and a reference target TR, respectively, and secondary electron beams 315, 316 generated from the targets TI, TR are superposed and imaged, and then, from a signal of an obtained superposed signal, a defect is detected in such a manner as to focus attention on the coherency of the secondary electron beams attributed to surface structures of the inspection target TI and the reference target TR.

The inspection target TI is, for example, a device pattern provided on the surface of a semiconductor substrate S (see FIG. 2) in the present embodiment. The reference target TR is a member from which a reference image for defect inspection is obtained and in which the reference image is superposed on an inspection image. In the present embodiment, the reference target TR is a pattern portion identical with the inspection target TI and provided on the same inspection semiconductor substrate S together with the inspection target TI. When the inspection target is a periodic pattern, an identical periodic pattern adjacent thereto or in the vicinity thereof is used as the reference target. When the patterns for several periods are the inspection targets, periodic patterns adjacent thereto or in the vicinity thereof for the same periods as those of the inspection patterns are the reference targets. Even when the inspection target is a random pattern, an identical pattern portion of a die (chip) adjacent thereto or in the vicinity thereof is the reference target. In addition, when there exists a mirror surface part where no pattern exists on the same wafer, that part can be the reference target. In the present embodiment, the mirror surface part which can be the reference target means a part in which a difference in height of the surface thereof is sized to an electron-optically sufficiently negligible degree as compared with that in height of the surface of the inspection target pattern. It is to be noted that the reference target is not limited to a surface area of an inspection substrate, and that as the reference target, an arbitrary member which is located in an arbitrary place ranging from the electron source 10 to the beam superposing unit 60 can be set as long as it provides the reference image for defect inspection.

The electron source 10 generates primary electron beams to illuminate the inspection target TI and the reference target TR therewith. Since the primary electron beams generated in the present embodiment need to have coherency of some kind to utilize the coherency of the secondary electron beams, the electron source 10 preferably has as small an electron emission surface as possible, ideally a point surface. Specific examples of the electron source include a cold field emission electron source having a single crystal or the like of W (tungsten), a thermal field emission electron source having a structure in which a substance such as zircon oxide ($ZrO_2$) is applied on a W (tungsten) single-crystal chip, etc. In addition, a nano-chip having a minuscule emission surface such as a carbon nano-tube (CNT) as the electron emission surface is a promising electron source for its high coherency.

The electron beam splitting unit 20 splits the generated primary electron beams 310 into the inspection target illuminating electron beams 311 and the reference target illuminating electron beams 312. As a technique to split the primary electron beams, for example, a technique utilizing beam deflection by an electromagnetic field is available. More specific splitting methods include a sector magnetic field type splitting method using a magnetic field prism, a biprism method using an electrostatic field, a splitting method combining the magnetic field and electric field, etc.

The illumination unit 42 condenses the split electron beams 311 and 312 to apply the same to the inspection target TI and the reference target TR, respectively. Hereupon, if, for example, an illumination condition for a Koehler illumination system or the like is set by an electromagnetic field lens, the electron beams 311 and 312 can be applied as collimation beams to the inspection target TI and the reference target TR, respectively.

The application of the inspection target illuminating electron beams 311 causes a secondary electron, a reflected electron and a back scattering electron to be generated from the inspection target TI, and a secondary electron, a reflected electron and a back scattering electron are also generated from the reference target TR to which the reference target illuminating electron beams 312 are applied. The light condensing unit 44 condenses these electrons as the secondary electron beams 315, 316. The secondary electron beams 315, 316 correspond to, for example, first and second secondary charged particle beams, respectively.

The beam superposing unit 50 superposes these secondary electron beams 315, 316. The map/projection unit 60 projects the superposed secondary electron beams to image them on a detection surface (not shown) of the electron detector 80. The electron detector 80 detects this image and thus transfers an image signal to the image processing unit 100. The electron detector 80 corresponds to, for example, a charged particle detection unit. The image processing unit 100 corresponds to, for example, a signal processing unit, and processes the transferred image signal to provide inspection data on the inspection target.

Specific processing contents of the image signal by the image processing unit 100 will be explained together with the effects of defect inspection by the inspection apparatus 1 of the present embodiment referring to FIGS. 2 to 9.

Figure 2:
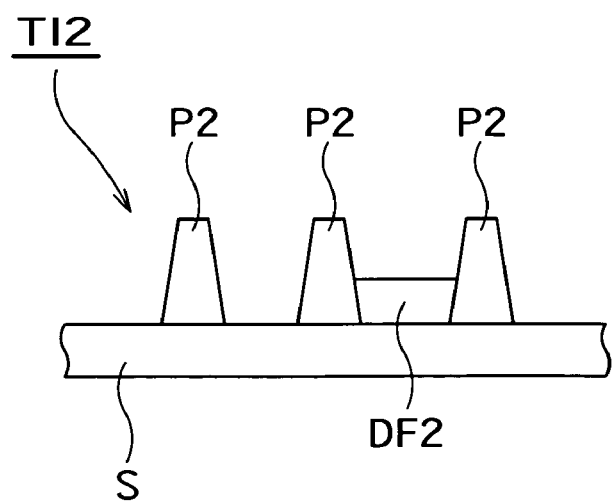
FIG. 2 is a sectional view showing one example of an inspection target.

FIG. 2 is a schematic sectional view showing one example of the inspection target TI. An inspection target TI2 shown in FIG. 2 includes a plurality of line patterns P2 periodically provided on the semiconductor substrate S and having tapered side surfaces. An abnormal defect DF2 formed of a material different from that of the line patterns P2 exists between the two patterns on the right side of the drawing out of the line patterns P2 shown in FIG. 2.

Figure 3:
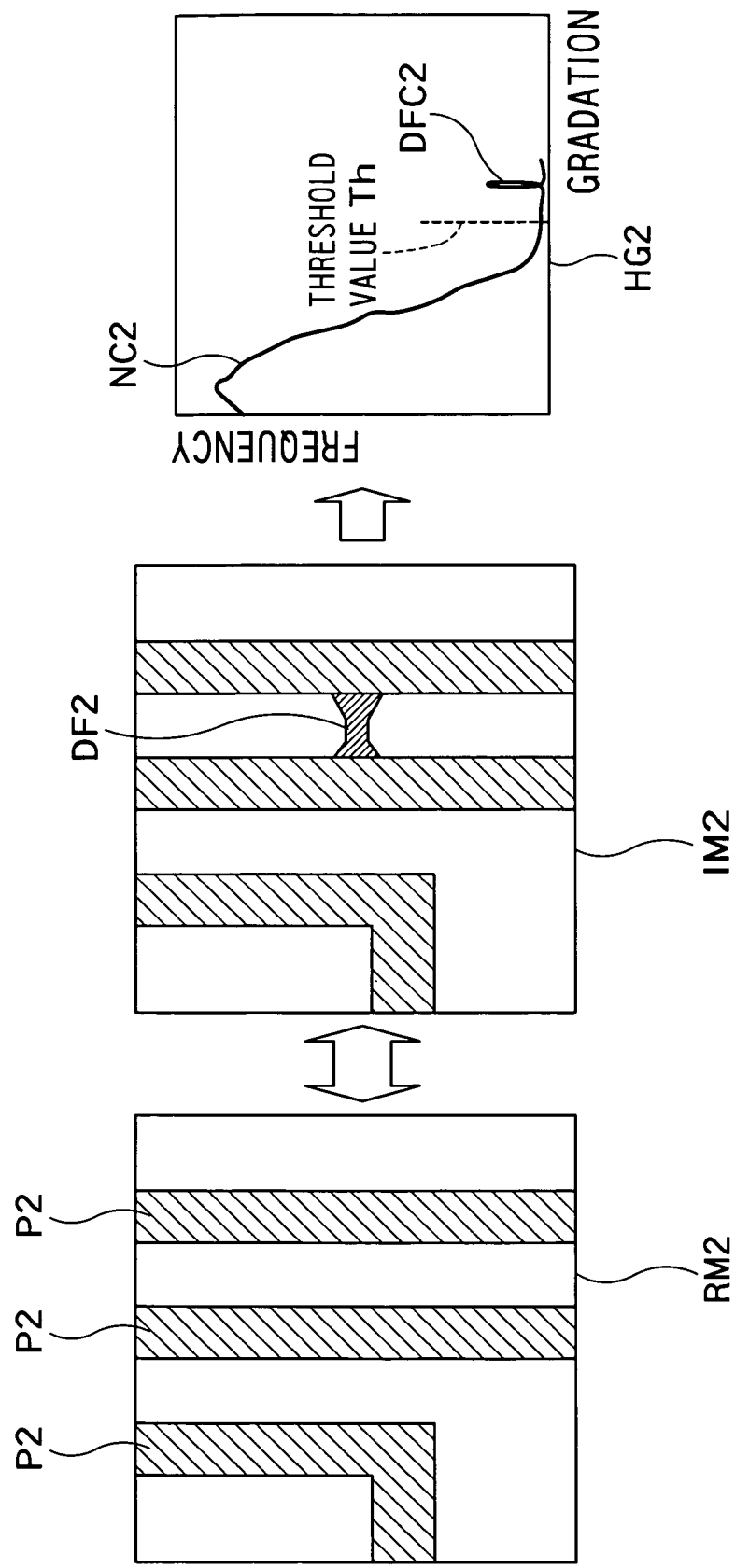
FIG. 3 is a diagram explaining one example of a defect inspection method according to a prior art as a comparative example of the present invention.

FIG. 3 is a diagram explaining one example of a defect inspection method according to a prior art. Before explaining the defect inspection method according to the present embodiment, a method shown in FIG. 3 is explained as a comparative example.

A pattern portion identical with that of the inspection target TI is set as the reference target TR to obtain its reference image RM2, and an inspection image IM2 of the inspection target TI is further obtained. Then, the image processing unit 100 calculates a difference of gradations between the images RM2 and IM2 on a pixel-to-pixel basis, and creates a difference gradation histogram HG2. As shown in FIG. 3, the difference gradation histogram HG2 includes a noise component NC2 and a defect component DFC2. Here, if a threshold value Th is set on the difference gradation histogram HG2, a prominently frequent portion exceeding the threshold value in an area of gradation value is judged as the defect component DFC2 such that the existence of the defect DF2 can be detected.

As in the defect DF2 shown in FIG. 2, when a film thickness is relatively large or when it is formed of a material different from that of the substrate surface and the patterns, the defect can be relatively easily detected even by the conventional inspection method. However, for example, as in an inspection target T14 shown in FIG. 4, when the film thickness of a defect DF4 (DF4a, DF4b) is very small or when it is formed of the same material as that of the underlying substrate surface, the strength of signals from the defects DF4a, DF4b is equal to the strength of a signal from the substrate surface underlying the pattern, and sufficient contrast can not be obtained in the defective portion as shown in an inspection image IM4 in FIG. 5. As a result, the frequency of a defect component DFC4 is lower in a difference gradation histogram HG4 created from the reference image RM2 and the inspection image IM4, and the defect detection is very difficult.

Figure 4:
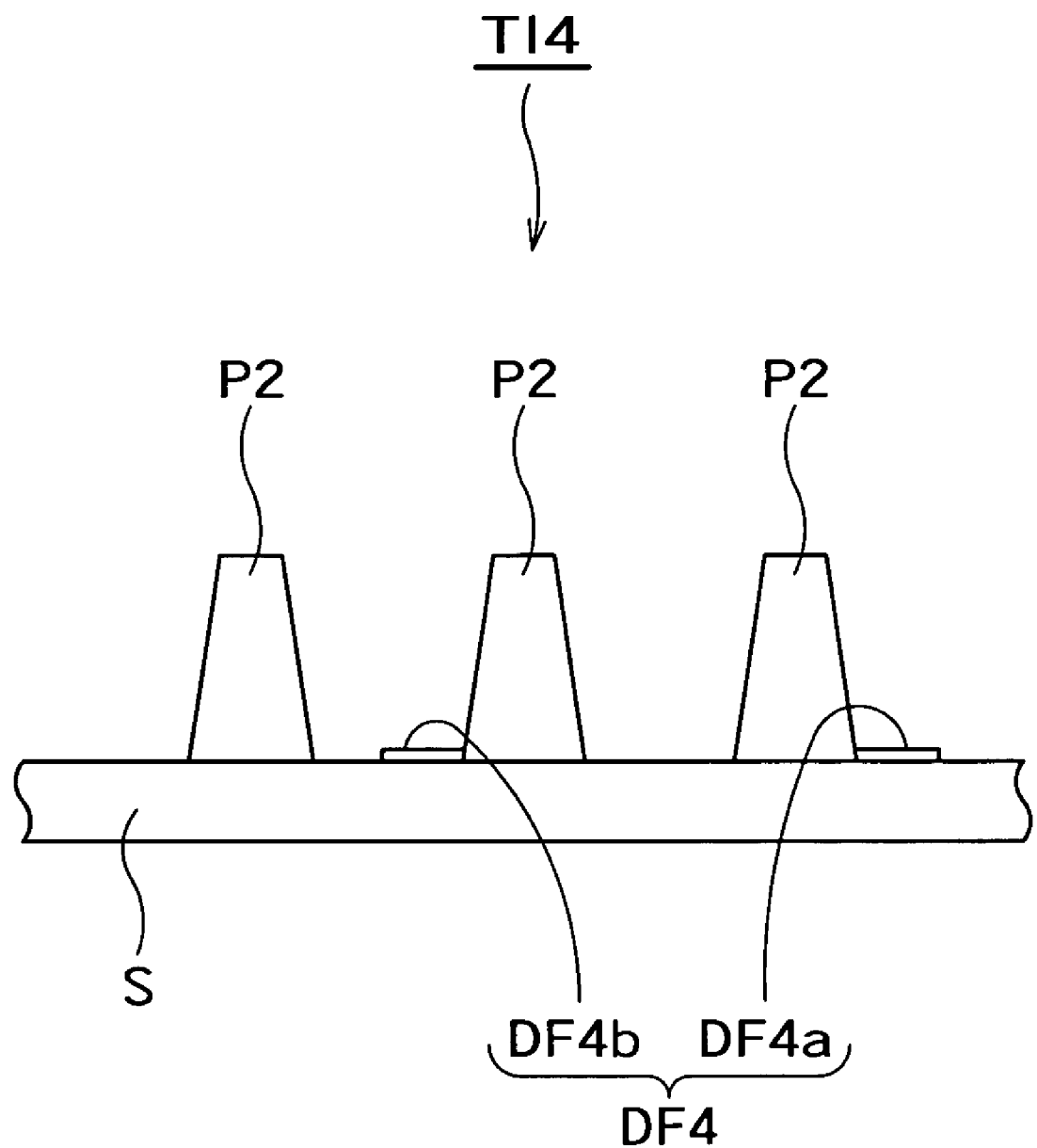
FIG. 4 is a sectional view showing another example of the inspection target.
Figure 5:
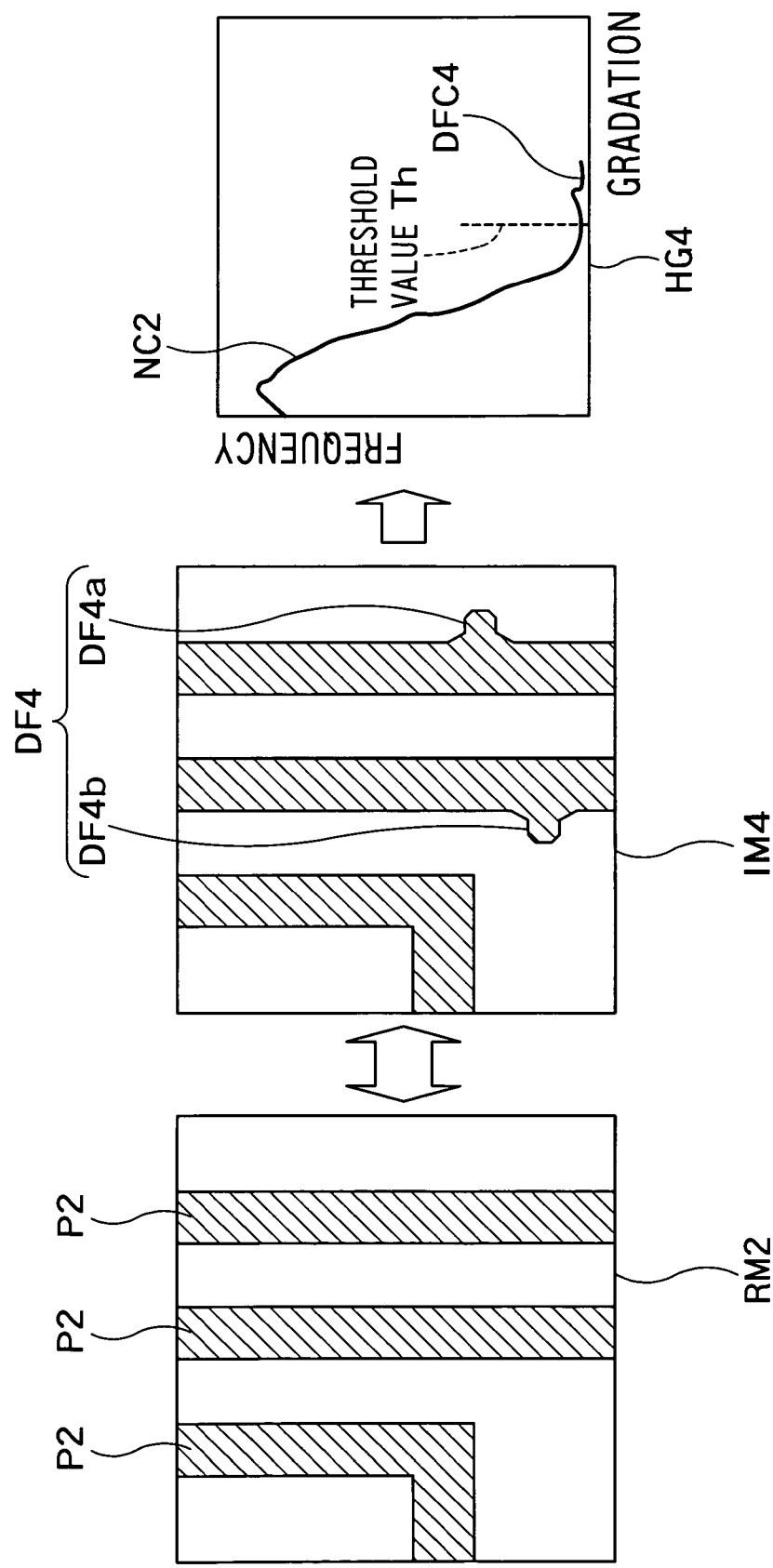
FIG. 5 is a diagram explaining problems of the defect inspection method shown in FIG. 3.
Figure 6:
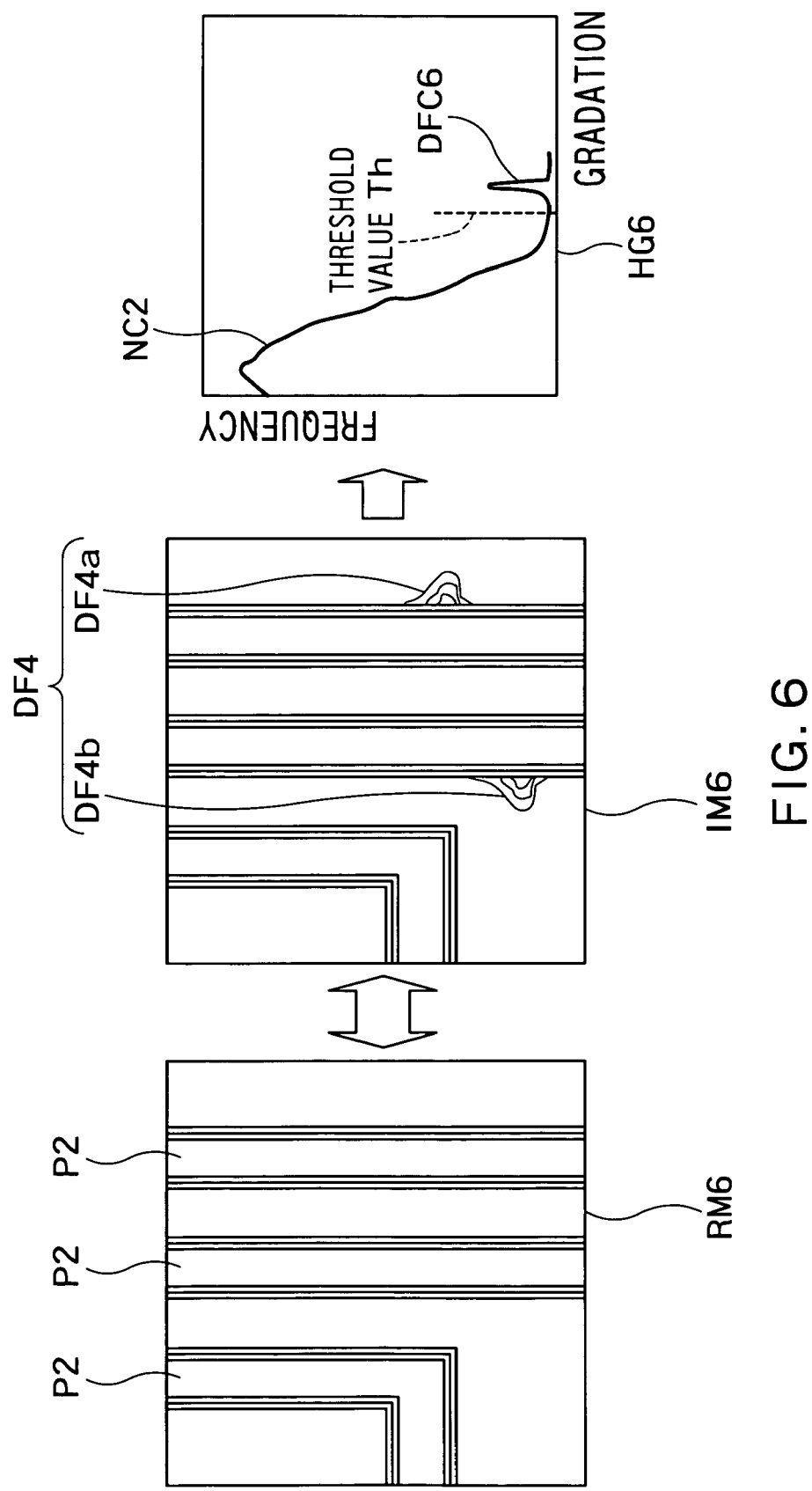
FIG. 6 is a diagram explaining effects of a substrate inspection method according to the first embodiment of the present invention.

FIG. 6 is a diagram explaining a case where the defect inspection method achieved by the inspection apparatus 1 of the present embodiment is applied to the inspection target T14 shown in FIG. 4. As shown in FIG. 6, according to the defect inspection of the present embodiment, a phase difference of the electron beams is generated in each image in accordance with the difference in height of the surface of the parts to which the electron beams are applied, and a interference pattern emerges in a secondary electron image to be obtained. Especially, in an inspection image IM6, information on the fine difference in height of the defects DF4a, DF4b in comparison with the surface of the substrate S is constructed as the interference pattern. This is due to the fact that the coherency of the electrons corresponding to the surface shape of the inspection target T14 and the reference target TR has become obvious, so that even when an electromagnetic field is formed immediately on the surface of the semiconductor substrate S due to, for example, charge-up, the information on the fine difference in height emerges in each image.

If a difference gradation histogram HG6 is created from these images RM6, IM6, a strength component DFC6 can be obtained from the very thin defect DF4 formed of the same material as that of the surface of the underlying substrate S between the patterns P2 and having a small height, as shown on a right side of the drawing in FIG. 6. Thus, if the threshold value Th is set as in the conventional manner, the defect DF4 can be easily detected.

Figure 7:
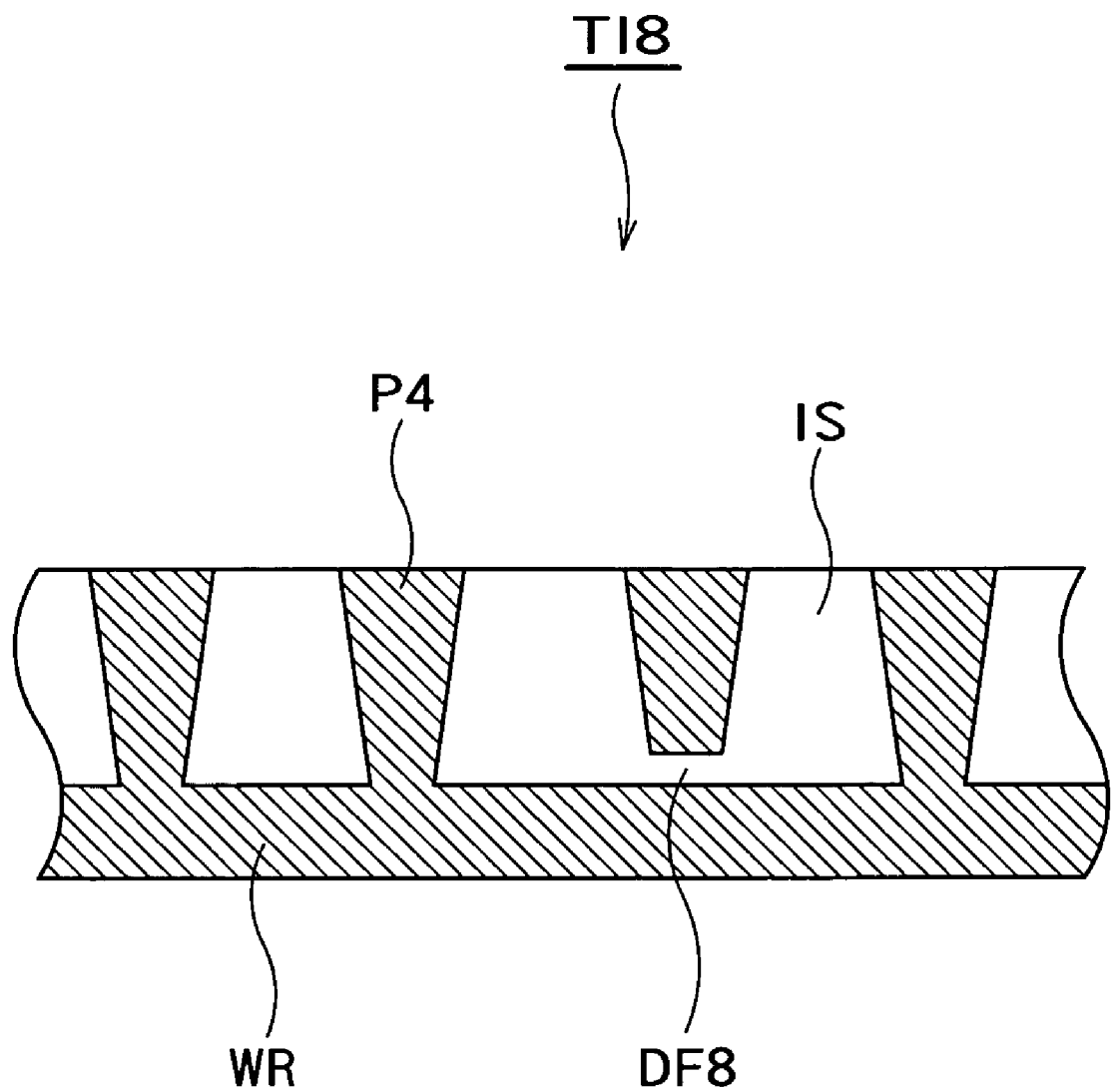
FIG. 7 is a sectional view showing still another example of the inspection target.

Next, the defect inspection will be described when the inspection target is a contact pattern or a via pattern (hereinafter simply referred to as "contact/via pattern"). FIG. 7 is a sectional view schematically showing an inspection target T18 comprising a contact/via pattern P4 formed in an insulating film IS to connect to an underlying wiring line WR. In the inspection target T18 shown in FIG. 7, a defect DF8 is generated which causes poor conduction to the underlying wiring line WR due to high resistance.

Figure 8:
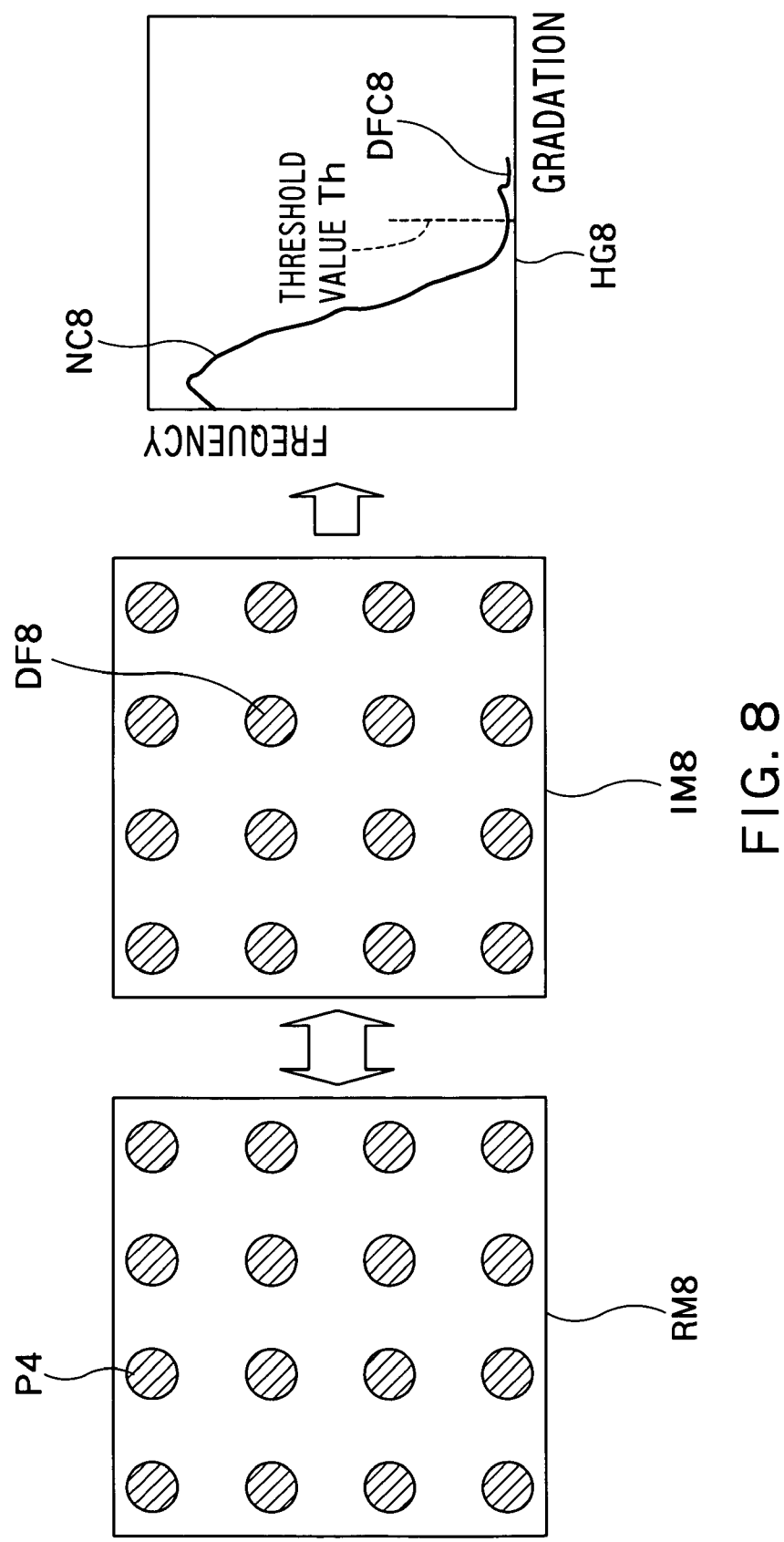
FIG. 8 is a diagram explaining problems when the defect inspection method shown in FIG. 3 is applied to the inspection target shown in FIG. 7.

FIG. 8 is a diagram explaining problems when the defect inspection method shown in FIG. 3 is applied to the inspection target T18 shown in FIG. 7, as a comparative example of a substrate inspection method of the present embodiment. As shown in an inspection image IM8 in the center of the drawing of FIG. 8, a potential contrast generated by a surface potential is low in an electron beam image, and it is thus impossible to obtain sufficient contrast for the defect DF8. As a result, the frequency of a defect component DFC8 is low in a difference gradation histogram HG8 as shown on the right side of the drawing of FIG. 8, and the defect detection has heretofore been difficult.

Figure 9:
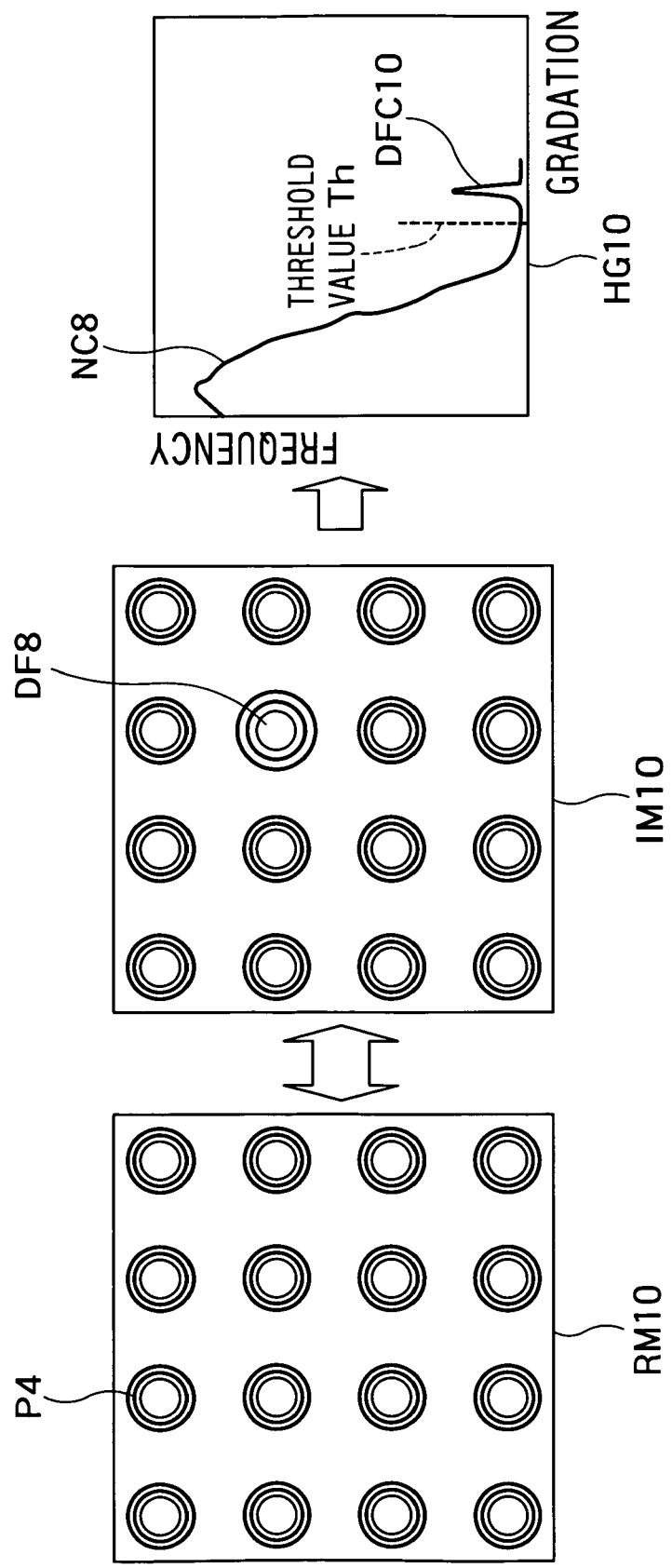
FIG. 9 is a diagram explaining effects when the substrate inspection method according to the first embodiment of the present invention is applied to the inspection target shown in FIG. 7.

FIG. 9 is a diagram explaining a case where the defect inspection method achieved by the inspection apparatus 1 of the present embodiment is applied to the inspection target TI8 shown in FIG. 7. On the surface of the defect DF8, the electric field is subtly changed due to irradiation of the primary electron beams and the phase difference between the electron beams is produced due to this change. Therefore, according to the substrate inspection of the present embodiment, the interference pattern in the defect DF8 is changed and becomes obvious in the image in such a manner as to be apparently different from the interference patterns in other normal parts, as shown in an inspection image IM10 in the center of FIG. 9. The use of such a difference in the interference patterns makes it possible to easily detect a defect component DFC10 on a difference gradation histogram HG10, as shown on the right side of the drawing of FIG. 9.

Figure 10:
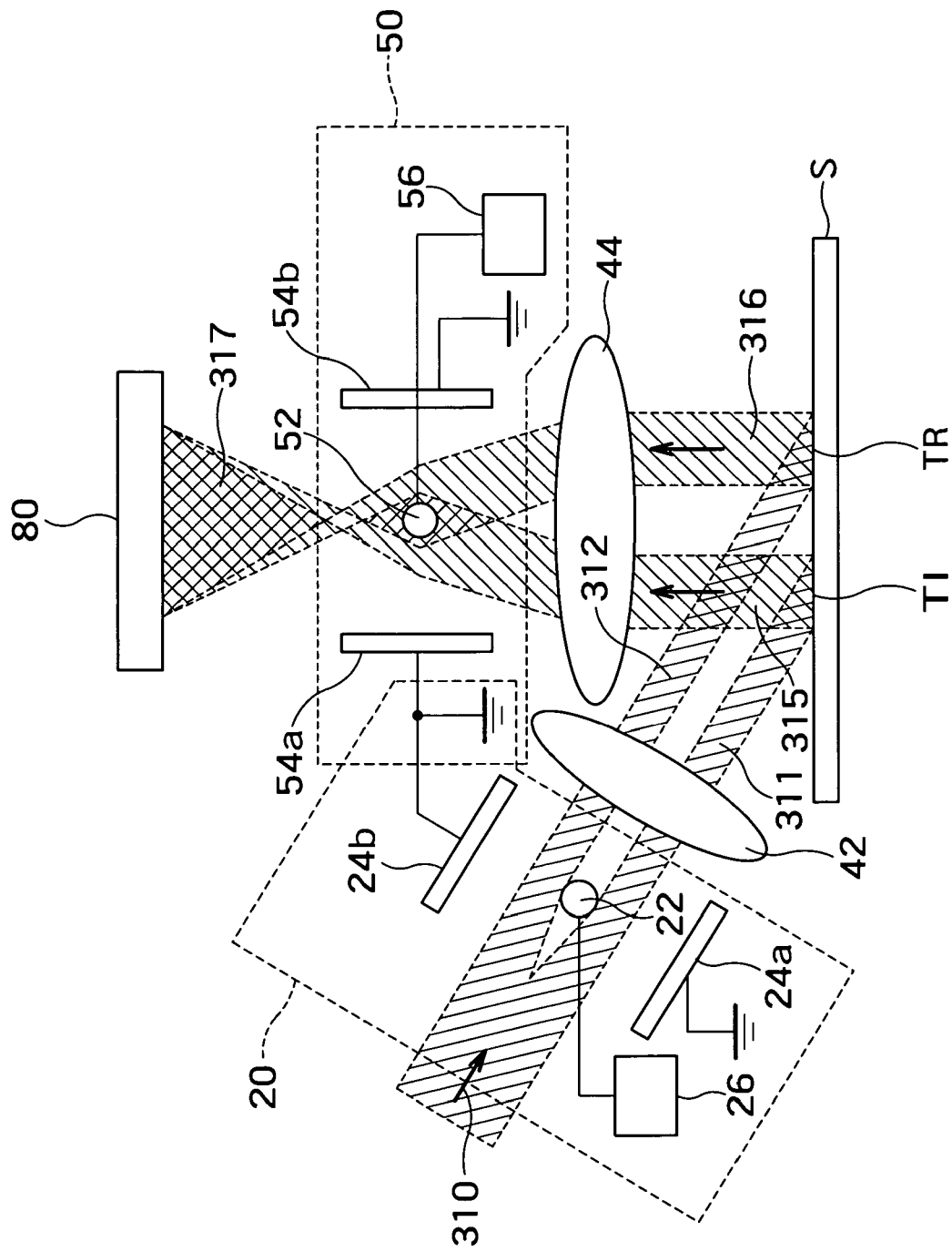
FIG. 10 is a diagram showing one specific example of an illumination beam splitting unit and a map/projection beam superposing unit which are provided in the apparatus shown in FIG. 1.

Here, a specific configuration example of the electron beam splitting unit 20 and the beam superposing unit 50 provided in the substrate inspection apparatus 1 shown in FIG. 1 will be described. FIG. 10 is a block diagram including the electron beam splitting unit 20 and the beam superposing unit 50 using an electrostatic biprism. It is to be noted that the map/projection unit 60 is omitted in FIG. 10 for simplification of explanation.

The electron beam splitting unit 20 includes a line electrode 22 connected to a power source 26, and parallel planetype electrodes 24a, 24b oppositely arranged to sandwich the line electrode 22. As shown in FIG. 10, while the parallel plane electrodes 24a, 24b are grounded, a negative voltage is applied to the line electrode 22 from the power source 26, such that the primary electron beams 310 can be split into two directions by electrostatic fields generated between the line electrode 22 and the parallel plane electrode 24a and between the line electrode 22 and the parallel plane electrode 24b, respectively. In the same manner, the beam superposing unit 50 is also constructed using the electrostatic biprism, and includes a line electrode 52 connected to a power source 56, and parallel plane electrodes 54a, 54b oppositely arranged to sandwich the line electrode 52. While the parallel plane electrodes 54a, 54b are grounded, a positive voltage is applied to the line electrode 52 from the power source 56, such that the secondary electron beams 315, 316 generated from the inspection target TI and the reference target TR, respectively, are superposed by electrostatic fields generated between the line electrode 52 and the parallel plane electrode 54a and between the line electrode 52 and the parallel plane electrode 54b, respectively.

As methods of splitting and superposing the beams, if a use is made of, in addition to the example shown in FIG. 10, a prism utilizing deflection by the magnetic field and deflection by an electromagnetic field deflecting field in which the magnetic field and electric field are mixed, similar effects can be expected.

(2) Second Embodiment

Figure 11:
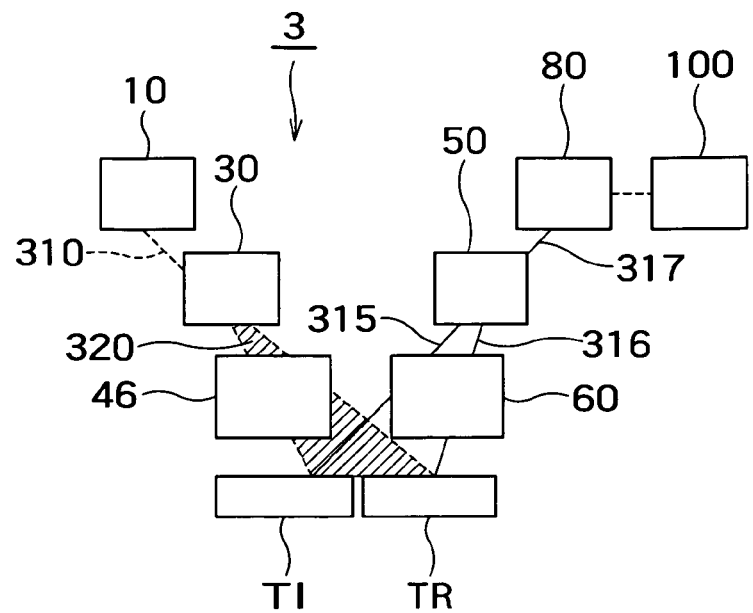
FIG. 11 is a block diagram showing a schematic configuration of a substrate inspection apparatus according to a second embodiment of the present invention.

FIG. 11 is a block diagram showing a schematic configuration of a substrate inspection apparatus according to a second embodiment of the present invention. A substrate inspection apparatus 3 shown in FIG. 11 comprises an electron beam expansion unit 30 and a collimation unit 46 instead of the electron beam splitting unit 20 and the illumination unit 42 provided in the substrate inspection apparatus 1 shown in FIG. 1. The substrate inspection apparatus 3 does not split primary electron beams 310 generated by an electron source 10 into inspection target illuminating electron beams 311 and reference target illuminating electron beams 312. The substrate inspection apparatus 3, however, forms illumination beams 320 with a large illumination area, simultaneously illuminates both an inspection target and a reference target with the illumination beams 320 collimated in the collimation unit 46, maps/projects, in a map/projection unit 60, a secondary electron, a reflected electron and a back scattering electron generated from target parts as secondary electron beams 315, 316, and superposes them in a beam superposing unit 50 to image them on a detection surface (not shown) of an electron detector 80, thereby detecting a signal of an electron beam image including interference patterns and processing it in an image processing unit 100. The inspection method of the present embodiment is suitable for the inspection of, for example, a memory pattern in which semiconductor patterns are periodically arranged, and allows the inspection of the inspection target every few periods. This is an approach called a cell to cell method in a defect inspection technique. Since the degree of integration is extremely high in a memory cell of a semiconductor pattern reaching a submicron level, it is enough for the inspection target of several periods to be illuminated in an area of several μm with the illumination beams. Therefore, a less burden is imposed on the electron beam expansion unit 30, and it is thus possible for the electron beam expansion unit 30 to also serve as the collimation unit 46.

(3) Third Embodiment

Figure 12:
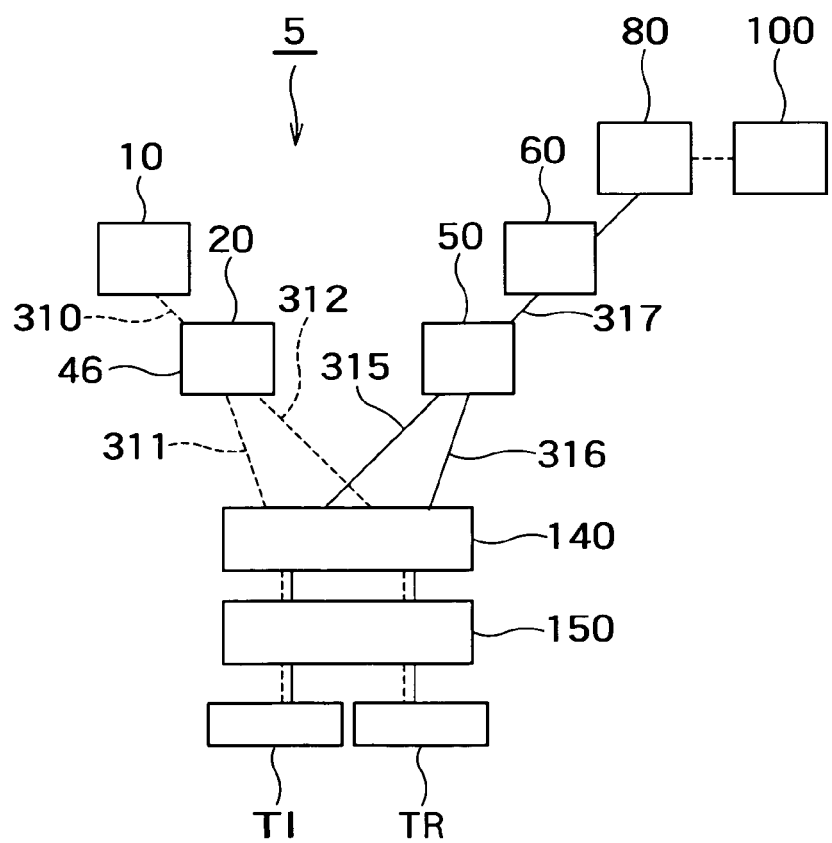
FIG. 12 is a block diagram showing a schematic configuration of a substrate inspection apparatus according to a third embodiment of the present invention.

FIG. 12 is a block diagram showing a schematic configuration of a substrate inspection apparatus according to a third embodiment of the present invention. A substrate inspection apparatus 5 shown in FIG. 12 is characterized in that it comprises a beam separator 140 and an illumination/condensation unit 150 instead of the illumination unit 42 and the light condensing unit 44 provided in the substrate inspection apparatus 1 shown in FIG. 1, and in that an inspection substrate is vertically illuminated by inspection target illuminating electron beams 311 and reference target illuminating electron beams 312 split from primary electron beams 310 by an electron beam splitting unit 20. The substrate inspection apparatus 5 in other parts is substantially the same as the substrate inspection apparatus 1 shown in FIG. 1. A secondary electron, a reflected electron and a back scattering electron generated from an inspection target TI and a reference target TR on the inspection substrate are condensed by the illumination/condensation unit 150 to become secondary electron beams 315, 316, which are deflected in the beam separator 140, and then superposed by a beam superposing unit 50 and projected by a map/projection unit 60, thus being imaged on a detection surface (not shown) of an electron detector 80.

Figure 13:
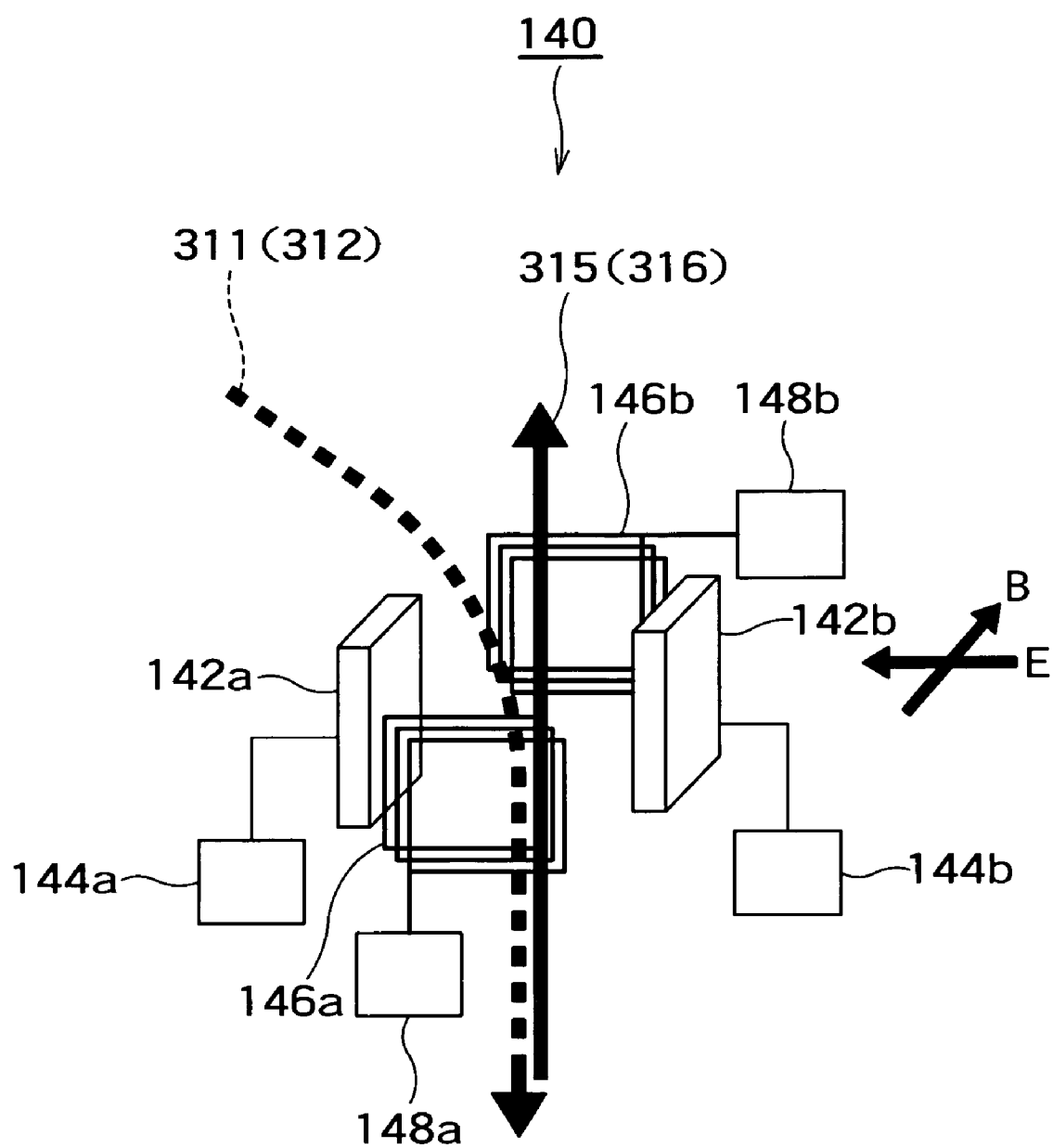
FIG. 13 is a diagram showing one specific example of a beam separator provided in the substrate inspection apparatus shown in FIG. 12.

One example of the beam separator 140 is shown in FIG. 13. The beam separator 140 shown in FIG. 13 comprises parallel plane electrodes 142a, 142b connected to power sources 144a, 144b, respectively, and oppositely arranged magnetic poles 146a, 146b connected to power sources 148a, 148b, respectively. The beam separator 140 orients an electric field excited by the parallel plane electrodes 142a, 142b and a magnetic field excited by the magnetic poles 146a, 146b perpendicular to each other (forms an E×B field) to deflect incident illumination beams so that they vertically enter the inspection substrate. On the other hand, the beam separator 140 linearly moves, in the E×B field, the secondary electron, the reflected electron and the back scattering electron which have been generated from the inspection target TI and the reference target TR on the inspection substrate and which come in from a direction opposite to that of the illumination beams. Thus, the illumination beams 311, 312 and the secondary electron beams 315, 316 can be separated from each other. The illumination beams and the secondary electron beams can be separated not only by such a method using the E×B field but also by a sector magnetic field.

(4) Fourth Embodiment

Figure 14:
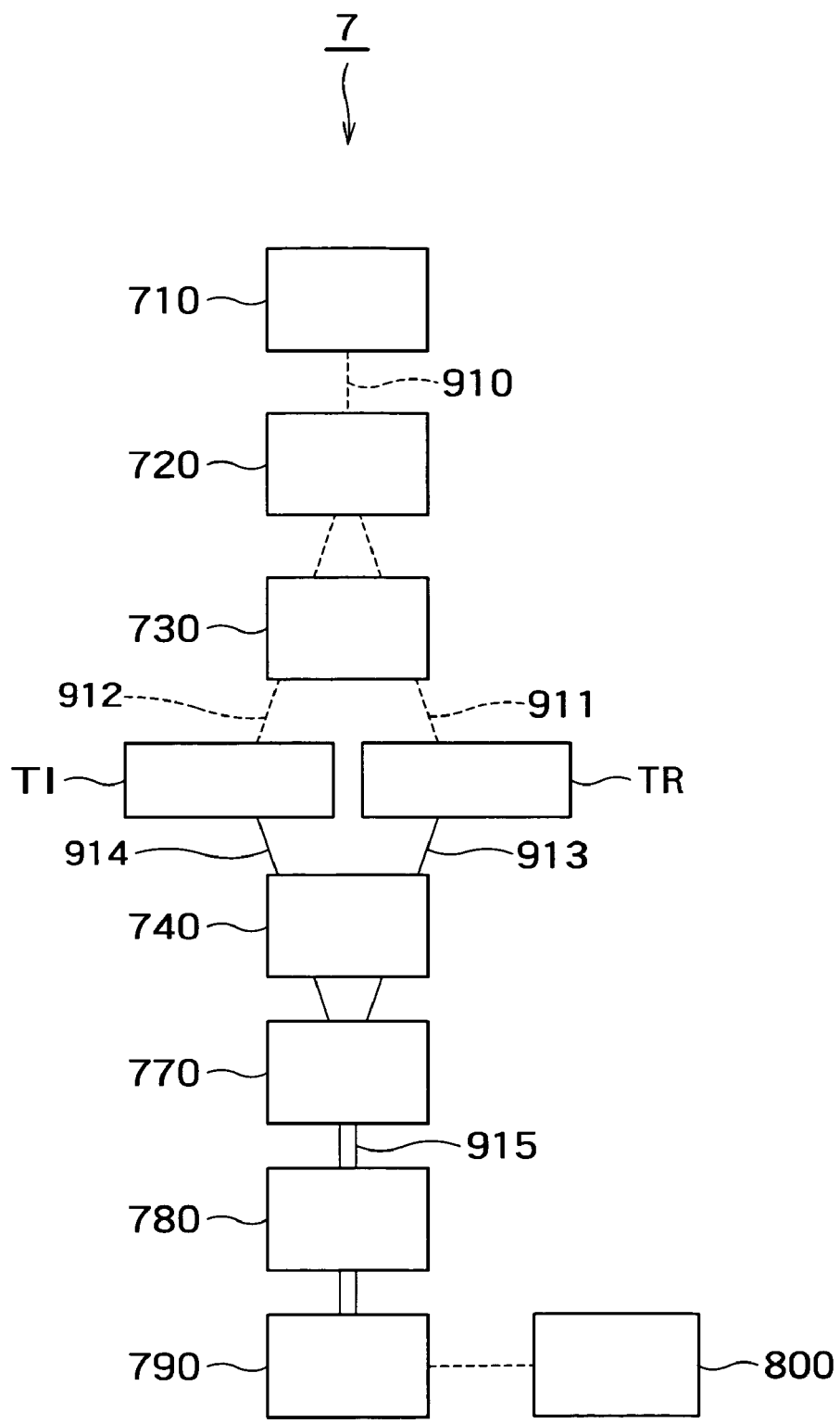
FIG. 14 is a block diagram showing a schematic configuration of a substrate inspection apparatus according to a fourth embodiment of the present invention.

FIG. 14 is a block diagram showing a schematic configuration of a substrate inspection apparatus according to a fourth embodiment of the present invention. A substrate inspection apparatus 7 shown in FIG. 14 is one example of a transmitted electron beam inspection apparatus, and suitable for defect inspection of an EB exposure mask such as a CP mask or an LEEPLE mask. The substrate inspection apparatus 7 comprises an electron source 710, an electron beam illumination unit 720, an electron beam splitting unit 730, a light condensing unit 740, a transmitted beam superposing unit 770, an imaging unit 780, an electron image detection unit 790 and an inspection image processing unit 800. The substrate inspection apparatus 7 superposes electron beams 912, 911 transmitted an inspection target TI and a reference target TR in the same mask, respectively, in the transmitted beam superposing unit 770, and then image them in the electron image detection unit 790, thereby making it possible to obtain a transmitted beam image including interference patterns. Specific functions of components and an inspection method of the present embodiment are substantially the same as those in the first embodiment, and therefore, redundant explanations are omitted here.

(5) Manufacturing Method of Semiconductor Device

If the substrate inspection methods in the embodiments described above are incorporated into a manufacturing method of a semiconductor device, a substrate surface can be inspected for faults and defects with high sensitivity, and it is therefore possible to manufacture a semiconductor device with a high yield.

While some of the embodiments of the present invention have been described above, the present invention is not limited to the embodiments described above, and it should be understood that various modifications can be made and applied within the scope thereof. A interference pattern image of an inspection part and a interference pattern image of a reference part are obtained and compared with each other in the embodiments described above, but when it is possible to create a reference interference pattern from, for example, design data on software, the interference pattern image of the inspection part alone may be obtained and compared therewith.

What is claimed is:

1. A substrate inspection method comprising:
    generating primary charged particle beams;
    applying the generated primary charged particle beams to an inspection target of a substrate;
    condensing secondary charged particle beams including first secondary charged particle beams, each having at least one of secondary charged particles, reflected charged particles, and back scattering charged particles which have been generated from the substrate, or transmitted charged particle beams including first transmitted charged particle beams which have been transmitted through the inspection target, a phase difference being generated between the secondary charged particle beams or between the transmitted charged particle beams in accordance with a structure of the inspection target;
    imaging the secondary charged particle beams or the transmitted charged particle beams;
    detecting the imaged secondary charged particle beams or transmitted charged particle beams and outputting a signal of a secondary charged particle beam image or a transmitted charged particle beam image including information on the phase difference; and
    detecting a defect in the inspection target by use of the information on the phase difference included in the secondary charged particle beam image or the transmitted charged particle beam image.

2. The substrate inspection method according to claim 1, further comprising:
    splitting the generated primary charged particle beams into a plurality of beam fluxes;
    applying a part of the split beam fluxes to a reference target;
    condensing second secondary charged particle beams, each including at least one of secondary charged particles, reflected charged particles and back scattering charged particles which have been generated from the reference target, or second transmitted charged particle beams which have transmitted the reference target; and
    superposing the first secondary charged particle beams and the second secondary charged particle beams or superposing the first transmitted charged particle beams and the second transmitted charged particle beams,
    wherein the imaged secondary charged particle beams or the imaged transmitted charged particle beams are constituted of the superposed first and second secondary charged particle beams or the superposed first and second transmitted charged particle beams, and
    the phase differences are generated between the first secondary charged particle beams and between the second secondary charged particle beams, respectively, or the phase differences are generated between the first transmitted charged particle beams and between the second transmitted charged particle beams, respectively, in accordance with the structures of the inspection target and the reference target.

3. The substrate inspection method according to claim 2, wherein at least one of the splitting of the primary charged particle beams and superposition of the secondary charged particle beams is performed by use of an electrostatic field deflecting field.

4. The substrate inspection method according to claim 2, wherein at least one of the splitting of the primary charged particle beams and superposition of the secondary charged particle beams is performed by use of a magnetic field deflecting field.

5. The substrate inspection method according to claim 2, wherein at least one of the splitting of the primary charged particle beams and superposition of the secondary charged particle beams is performed by use of an electromagnetic field deflecting field.

6. The substrate inspection method according to claim 2, wherein the split beam fluxes are collimated to irradiate the inspection target and the reference target, respectively.

7. The substrate inspection method according to claim 2, wherein the split beam fluxes substantially vertically irradiate the inspection target and the reference target, respectively.

8. The substrate inspection method according to claim 1, further comprising:
   expanding cross sectional areas of the beam fluxes of the primary charged particle beams so that the primary charged particle beams irradiate the inspection target and a reference target;
   collimating the expanded beam fluxes to apply the same to the inspection target and the reference target;
   condensing second secondary charged particle beams including at least one of secondary charged particles, reflected charged particles and back scattering charged particles which have been generated from the reference target, or second transmitted charged particle beams which have transmitted the reference target; and
   superposing the first secondary charged particle beams and the second secondary charged particle beams or superposing the first transmitted charged particle beams and the second transmitted charged particle beams,
   wherein the imaged secondary charged particle beams or transmitted charged particle beams are constituted of the superposed first and second secondary charged particle beams or the superposed first and second transmitted charged particle beams, and
   phase differences are generated between the first secondary charged particle beams and second secondary charged particle beams, respectively, or phase differences are generated between the first transmitted charged particle beams and between the second transmitted charged particle beams, respectively, in accordance with the structures of the inspection target and the reference target.

9. The substrate inspection method according to claim 1, further comprising:
   creating a reference target from design data on the inspection target, and creating, by operation processing, a secondary charged particle beam image of the reference target or a transmitted charged particle beam image of the reference target which is obtained when the primary charged particle beams are applied to the reference target,
   wherein detecting the defect in the inspection target includes using the secondary charged particle beam image or the transmitted charged particle beam image of the reference target as an inspection standard.

10. A manufacturing method of a semiconductor device comprising a substrate inspection method, said substrate inspection method including:
    generating primary charged particle beams;
    applying the generated primary charged particle beams to an inspection target of a substrate;
    condensing secondary charged particle beams including first secondary charged particle beams, each having at least one of secondary charged particles, reflected charged particles and back scattering charged particles which have been generated from the substrate, or transmitted charged particle beams including first transmitted charged particle beams which have been transmitted through the inspection target, a phase difference being generated between the secondary charged particle beams or between the transmitted charged particle beams in accordance with a structure of the inspection target;
    imaging the secondary charged particle beams or the transmitted charged particle beams;
    detecting the imaged secondary charged particle beams or transmitted charged particle beams and outputting a signal of a secondary charged particle beam image or a transmitted charged particle beam image including information on the phase difference; and
    detecting a defect in the inspection target by use of the information on the phase difference included in the secondary charged particle beam image or the transmitted charged particle beam image.

11. The manufacturing method of a semiconductor device according to claim 10, further comprising:
    splitting the generated primary charged particle beams into a plurality of beam fluxes;
    applying a part of the split beam fluxes to a reference target;
    condensing second secondary charged particle beams, each including at least one of secondary charged particles, reflected charged particles and back scattering charged particles which have been generated from the reference target, or second transmitted charged particle beams which have transmitted the reference target; and
    superposing the first secondary charged particle beams and the second secondary charged particle beams or superposing the first transmitted charged particle beams and the second transmitted charged particle beams,
    wherein the imaged secondary charged particle beams or the imaged transmitted charged particle beams are constituted of the superposed first and second secondary charged particle beams or the superposed first and second transmitted charged particle beams, and
    the phase differences are generated between the first secondary charged particle beams and between the second secondary charged particle beams, respectively, or the phase differences are generated between the first transmitted charged particle beams and between the second transmitted charged particle beams, respectively, in accordance with the structures of the inspection target and the reference target.

12. The manufacturing method of a semiconductor device according to claim 11, wherein the split beam fluxes substantially vertically irradiate the inspection target and the reference target, respectively.

13. The manufacturing method of a semiconductor device according to claim 10, further comprising:
    creating a reference target from design data on the inspection target, and creating, by operation processing, a secondary charged particle beam image of the reference target or a transmitted charged particle beam image of the reference target which is obtained when the primary charged particle beams are applied to the reference target,
    wherein detecting the defect in the inspection target includes using the secondary charged particle beam image or the transmitted charged particle beam image of the reference target as an inspection standard.

14. A substrate inspection apparatus comprising:
    a beam source which generates primary charged particle beams;
    an illumination unit which applies the generated primary charged particle beams to an inspection target;
    a condensing unit which condenses secondary charged particle beams including at least one of secondary charged particles, reflected charged particles and back scattering charged particles which have been generated from the inspection target, or transmitted charged particle beams which have transmitted the inspection target;
    an imaging unit which images the secondary charged particle beams or the transmitted charged particle beams;
    a charged particle detection unit which detects the imaged secondary charged particle beams or the imaged transmitted charged particle beams, and outputs a signal of a secondary charged particle beam image or a transmitted charged particle beam image including information on a phase difference generated between the secondary charged particle beams or between the transmitted charged particle beams in accordance with a structure of the inspection target; and a signal processing unit which processes the signal of the secondary charged particle beam image or the transmitted charged particle beam image and outputs data on a defect in the inspection target on the basis of the information on the phase difference.

15. The substrate inspection apparatus according to claim 14, further comprising:

a charged particle beam splitting unit which splits the generated primary charged particle beams into a plurality of beam fluxes; and a charged particle beam superposing unit which superposes the split beam fluxes, wherein the illumination unit applies a part of the beam fluxes split by the charged particle beam splitting unit to a reference target, the condensing unit condenses second secondary charged particle beams, each of the second secondary charged particle beams includes at least one of secondary charged particles, reflected charged particles and back scattering charged particles which have been generated from the reference target, or second transmitted charged particle beams which have transmitted the reference target, the charged particle beam superposing unit superposes the first secondary charged particle beams and the second secondary charged particle beams or superposes the first transmitted charged particle beams and the second transmitted charged particle beams, the imaged secondary charged particle beams or transmitted charged particle beams is constituted of the superposed first and second secondary charged particle beams or the superposed first and second transmitted charged particle beams, and the phase differences are generated between the first secondary charged particle beams and between the second secondary charged particle beams, respectively, or phase differences are generated between the first transmitted charged particle beams and between the second transmitted charged particle beams, respectively, in accordance with the structures of the inspection target and the reference target.

16. The substrate inspection apparatus according to claim 15, wherein the charged particle beam splitting unit includes a prism utilizing deflection by an electrostatic field.

17. The substrate inspection apparatus according to claim 15, wherein the charged particle beam splitting unit includes a prism utilizing deflection by a magnetic field.

18. The substrate inspection apparatus according to claim 15, wherein the charged particle beam splitting unit includes a prism utilizing deflection by an electromagnetic field deflecting field in which a magnetic field and an electric field are mixed.

19. The substrate inspection apparatus according to claim 14, further comprising:

a charged particle beam expansion unit which expands cross sectional areas of the beam fluxes of the primary charged particle beams so that the primary charged particle beams irradiate the inspection target and a reference target; and a collimator which collimates the expanded beam fluxes to apply the same to the inspection target and the reference target;

a charged particle beam superposing unit which superposes the first secondary charged particle beams and second secondary charged particle beams or superposes the first transmitted charged particle beams and second transmitted charged particle beams, the second secondary charged particle beams including at least one of secondary charged particles, reflected charged particles and back scattering charged particles which have been generated from the reference target, the second secondary charged particle beams being condensed by the condensing unit, the second transmitted charged particle beams having transmitted the reference target, and the second transmitted charged particle beams being condensed by the condensing unit;

wherein the imaged secondary charged particle beams or transmitted charged particle beams are constituted of the superposed first and second secondary charged particle beams or the superposed first and second transmitted charged particle beams, and the phase differences are generated between the first secondary charged particle beams and second secondary charged particle beams, respectively, or the phase differences are generated between the first transmitted charged particle beams and between the second transmitted charged particle beams, respectively, in accordance with the structures of the inspection target and the reference target.

20. The substrate inspection apparatus according to claim 15, wherein the illumination unit and the condensing unit deflect the primary charged particle beams so that the beam fluxes substantially vertically irradiate the inspection target and the reference target, respectively.

21. The substrate inspection method according to claim 1, wherein the information in the secondary charged particle beam image or the transmitted charged particle beam image includes an interference pattern due to the phase difference.

22. The substrate inspection apparatus according to claim 14, wherein the information in the secondary charged particle beam image or the transmitted charged particle beam image includes an interference pattern due to the phase difference.

* * * * *